United States Patent
Lu et al.

(10) Patent No.: US 9,653,411 B1
(45) Date of Patent: May 16, 2017

(54) ELECTRONIC PACKAGE THAT INCLUDES FINE POWDER COATING

(71) Applicant: Intel Corporation, Santa Clara, CA (US)

(72) Inventors: Donglai David Lu, Chandler, AZ (US); Zhaozhi George Li, Chandler, AZ (US); Matthew T. Magnavita, Gilbert, AZ (US); Amram Eitan, Scottsdale, AZ (US); Peng Chen, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/974,771

(22) Filed: Dec. 18, 2015

(51) Int. Cl.
*H01L 23/28* (2006.01)
*H01L 23/00* (2006.01)
*H01L 23/31* (2006.01)
*H01L 23/373* (2006.01)
*H01L 21/56* (2006.01)

(52) U.S. Cl.
CPC .......... *H01L 23/562* (2013.01); *H01L 21/563* (2013.01); *H01L 23/3121* (2013.01); *H01L 23/3736* (2013.01)

(58) Field of Classification Search
CPC ............... H01L 23/562; H01L 23/3121; H01L 23/3736; H01L 21/563
See application file for complete search history.

(56) References Cited

U.S. PATENT DOCUMENTS

| 5,284,286 | A | * | 2/1994 | Brofman | B22F 3/11 228/119 |
| 6,340,113 | B1 | * | 1/2002 | Avery | B23K 35/0244 228/233.2 |
| 8,167,189 | B2 | * | 5/2012 | Zinn | B23K 1/0008 228/119 |
| 2002/0037397 | A1 | * | 3/2002 | Suzuki | H05K 1/024 428/209 |
| 2003/0123229 | A1 | * | 7/2003 | Egitto | B29C 59/14 361/709 |

(Continued)

FOREIGN PATENT DOCUMENTS

JP 10-22425 * 2/1998

OTHER PUBLICATIONS

MTD (jp 10-22425).*

*Primary Examiner* — A. Sefer
(74) *Attorney, Agent, or Firm* — Schwegman Lundberg & Woessner, P.A.

(57) ABSTRACT

An electronic package that includes a substrate; an electronic component mounted to a surface of the substrate; and a porous coating that includes grains of metal powder formed onto the electronic component by melting the metal powder onto the electronic component. An electronic package that includes a substrate; an electronic component mounted to a surface of the substrate; and a porous coating that includes grains of metal powder formed onto the substrate by melting the metal powder onto the substrate. An electronic package that includes a substrate; an electronic component mounted to a surface of the substrate; an initial mold covering the electronic component; and a porous coating that includes grains of metal powder formed onto the initial mold by melting the metal powder onto the initial mold.

10 Claims, 3 Drawing Sheets

(56) References Cited

U.S. PATENT DOCUMENTS

| | | | | |
|---|---|---|---|---|
| 2007/0212521 | A1* | 9/2007 | Bessho | C09J 7/026 428/137 |
| 2008/0185713 | A1* | 8/2008 | Dani | H01L 23/10 257/713 |
| 2008/0237845 | A1* | 10/2008 | Kim | G06F 1/203 257/715 |
| 2009/0008800 | A1* | 1/2009 | Nakatani | H01L 21/563 257/778 |
| 2009/0023245 | A1* | 1/2009 | Kitae | H05K 3/3436 438/108 |
| 2012/0187423 | A1* | 7/2012 | Tsai | H01L 33/501 257/79 |
| 2013/0087605 | A1* | 4/2013 | Kubota | B23K 35/36 228/256 |
| 2013/0313309 | A1* | 11/2013 | Kitajima | H01L 21/64 228/180.5 |
| 2015/0155243 | A1* | 6/2015 | Chen | H01L 23/562 257/724 |

* cited by examiner

ELECTRONIC PACKAGE THAT INCLUDES FINE POWDER COATING

TECHNICAL FIELD

Embodiments described herein generally relate to electronic packages, and more particularly to electronic packages that include fine powder coatings.

BACKGROUND

Two of the biggest challenges in developing next generation packaging technologies are package warpage reduction and package thickness reduction. These challenges are due to the ever increasing demand in the consumer microelectronic market for smaller and thinner devices.

In many conventional electronic packages an over-mold is used to try to control temperature-related warpage of electronic packages. There are several drawbacks that are associated with conventional over-mold electronic packaging solutions. These drawbacks are due to manufacturing considerations associated with using (i) relatively high temperatures during fabrication of the electronic packages; and (ii) smaller form factors for the electronic packages.

Electronic packages may differ in size and/or form factor. One of the drawbacks with conventional electronic packages relates to finding a proper mold material for different types of electronic packages. One important consideration when over-molding is balancing the electronic component(s) that form the electronic package with the over-mold.

As an example, a die area of the electronic package may have a very different stiffness and thermal expansion coefficient than a non-die area. Therefore, when the electronic package geometry changes, the over-mold material and over-mold thickness may need to be reconfigured.

There is no universal over-mold solution for different types of electronic packages. The overlying mold that is typically used in electronic packages often cracks due to excessive mechanical stresses (especially in the edge regions of the mold). Changing over-mold materials for each type of electronic package does not promote efficient manufacturing of electronic packages.

Many conventional electronic packages typically include a separate solid stiffener that is mounted to the back side of a die using an adhesive. One of the drawbacks with using such a stiffener is that there is often failure due to delamination between the adhesive and the stiffener.

DESCRIPTION OF EMBODIMENTS

Figure 1:
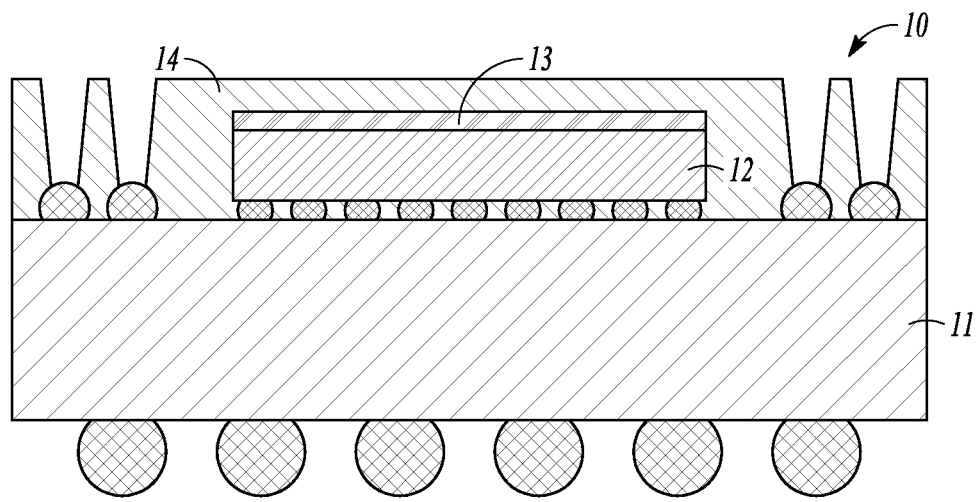
FIG. 1 shows a schematic section view of an example electronic package.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

The electronic packages described herein may include a thin metal coating that is deposited within the electronic packages by melting fine powder during a coating process. The thin metal coating is applied to balance temperature-related warpage throughout the entire electronic package.

Pulverized metal may be deposited onto the electronic package by passing the pulverized metal through a plasma melting process (e.g., by using an Atmospheric Pressure Plasma Jet) in a carrier stream. The Atmospheric Pressure Plasma Jet both melts and accelerates metal particles towards the electronic package surface in order to deposit the metal particles on the electronic package surface.

In some forms, the electronic package may include a mold that is applied at two different times. As an example, a thin portion of the mold may be applied on the back of a silicon die before the thin metal coating is deposited onto the initial mold. Once the thin metal coating is deposited onto the first portion of the mold, additional molding material may be applied on top of the thin metal coating.

The initial mold is placed on the silicon die in part to ensure satisfactory bonding between the silicon and the mold as well as between the mold and the thin metal coating. Attaching the thin metal coating after the initial mold is applied, and before the subsequent additional mold is applied, may improve the reliability of the electronic package.

Depositing the thin metal layer to the initial mold (or directly to the electronic component or the substrate) may improve the metal adhesion and surface bonding strength, especially when compared to conventional stiffeners. In addition, directly depositing the thin metal coating onto the initial mold in this manner may not induce additional stress in the over-mold because the metal coating edge morphology may have a porous structure.

The porous structure may provide improved substrate warpage control over conventional stiffeners. In addition, the porous metal coating may facilitate direct application of the porous metal coating to (i) the substrate; (ii) an electronic component; and/or (iii) a mold without the need for any additional bonding materials. Reducing the need for extra bonding materials may minimize costs, increase production speed and reduce the possibility of metal delamination.

In addition, the entire surface of the thin metal coating may be activated for better adhesion, especially when using a plasma spray process to apply the thin metal coating. The thin metal coating may be activated by using additives that improve adhesion of the coating to the substrate. Some example additives includes polymer-based and/or epoxy-based materials.

The molded electronic packages described herein may provide some form of temperature-related warpage control for electronic packages. Controlling the temperature-related warpage may reduce yield losses that can occur when fabricating molded electronic packages that include stiffeners. The molded electronic packages that are described herein may also utilize cost effective electronic packaging technology in order to reduce the costs that are associated with fabricating molded electronic packages.

FIG. 1 shows a schematic section view of an example electronic package 10. The electronic package 10 includes a substrate 11 and an electronic component 12 mounted to a surface of the substrate 11. The electronic package 10 further includes a coating 13 formed onto the electronic component 12 by melting powder onto the electronic component 12.

In some forms, the substrate 11 is a printed circuit board. The type of substrate 11 that is included in the electronic package 10 will be depend in part on the type of electronic component 12 that is mounted to the substrate 11 as well as the application where the electronic package 10 is to be used (among other factors).

In some forms, the electronic component 12 may be a die. It should be noted that the electronic component 12 may be any active or passive component(s). In addition, the type of electronic component 12 that is included in the electronic package 10 will depend in part on the application where the electronic package 10 is to be used (among other factors).

As an example, the coating 13 may be between 5 and 40 microns thick. The thickness of the coating 13 will be depend in part on the degree of stiffening that is required of the coating 13 in the electronic package 10.

In some forms, the powder that is melted to form the coating includes one or more metals. As examples, the metals may be copper, nickel, stainless steel (among other types of metals and/or alloys).

In addition, the coating 13 may have a grain size that is less than 30 micrometers. The grain size of the coating 13 will depend in part on the type of material that is used for the coating 13 as well as the process that is used to apply the coating 13 to the electronic component (among other factors).

In the example form of the electronic package 10 shown in FIG. 1, the coating 13 entirely covers the electronic component 12. In other forms, the coating 13 may partially cover the electronic component 12.

As shown in FIG. 1, the electronic package 10 may further include a mold 14 that covers the electronic component 12. The overall size, type, and shape of the mold 14 may depend in part on the overall size, type and shape of the substrate 11 and the electronic component 12 (among other factors).

In addition, the types of materials that are utilized for the mold 14 will depend in part on the manufacturing processes that are used to fabricate the electronic package 10. In some forms, the mold 14 may be an organic polymer material (e.g., a thermoset epoxy material) (among other types of materials). As an example, the mold 14 may include 20-80% epoxy resin (among other types of materials) and be mixed with various other materials. In addition, the mold 14 may also be partially formed of silica.

It should be noted that molds 14 described herein may be formed as part of the electronic package 10 in any manner that is known now, or discovered in the future. Some example processes for forming the mold 14 include, but are not limited to, injection molding, compression molding, press-fit configurations and semi-additive lithography processes (among other types of processes).

Figure 2:
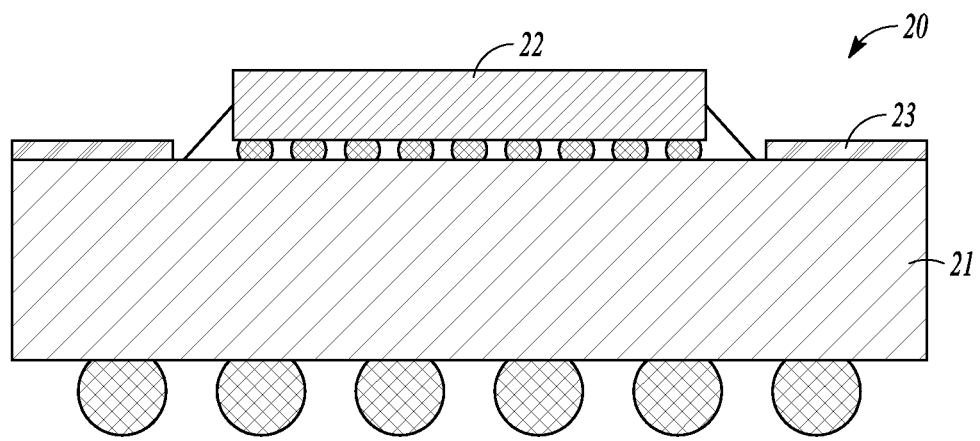
FIG. 2 shows a schematic section view of another example electronic package.

FIG. 2 shows a schematic section view of another example electronic package 20. The electronic package 20 includes a substrate 21 and an electronic component 22 mounted to a surface of the substrate 21.

The electronic package 20 further includes a coating 23 formed onto the substrate 21 by melting powder on to the substrate 21. It should be noted that the coating 23 may cover a portion (or all) of the substrate 21 that is not covered by the electronic component 22.

The type of substrate 21 that is included in the electronic package 10 may be similar to any of the substrates 11 described above. In addition, the type of electronic component 22 that is included in the electronic package 20 may be similar to any of the electronic components 12 described above. It should be noted that the coating 23 may be similar to any of the coatings 13 described above.

In some forms, the electronic package 20 may further include a mold (not shown in FIG. 2) that covers the substrate 21, coating 23 and the electronic component 22. It should be noted that the mold may be similar to any of the molds 14 described above.

Figure 3:
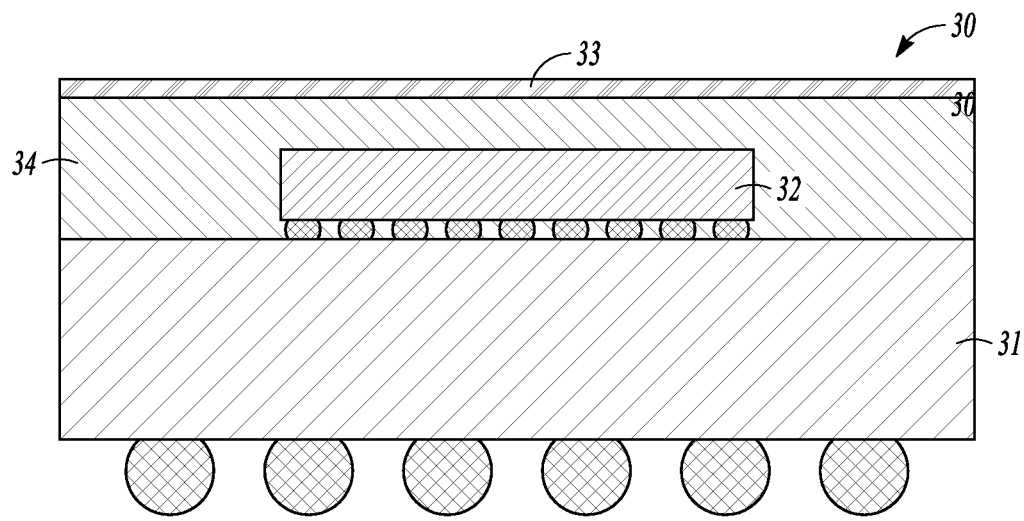
FIG. 3 shows a schematic section view of still another example electronic package.
Figure 4:
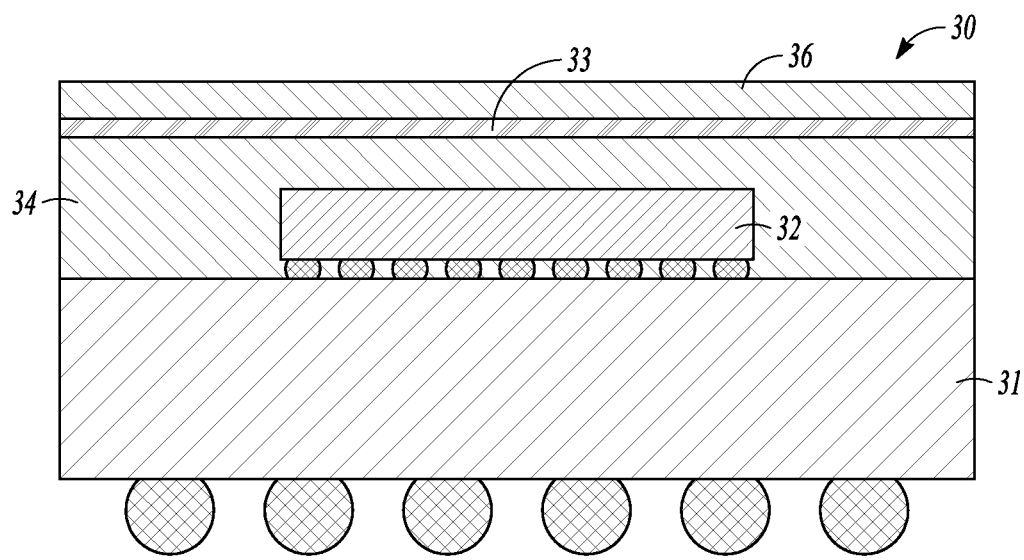
FIG. 4 shows a schematic section view of the example electronic package shown in FIG. 3 where an additional mold has been added to the electronic package.

FIG. 3 shows a schematic section view of still another example electronic package 30. FIG. 4 shows a schematic section view of the example electronic package 30 shown in FIG. 3 where an additional mold has been added to the electronic package 30.

The electronic package 30 includes a substrate 31 and an electronic component 32 mounted to a surface of the substrate 31. As shown in FIG. 3, an initial mold 34 covers the electronic component 32. A coating 33 is formed onto the initial mold 34 by melting powder onto the initial mold 34.

It should be noted that the substrate 31 may be similar to any of the substrates 11 described above. In addition, the electronic component 32 may be similar to any of the electronic components 12 described above. It should be noted that the coating 33 may be similar to any of the coatings 13 described above.

As shown in FIG. 4, the electronic package 30 may further include an additional mold 36 that covers the coating 33. The initial mold 34 and the additional mold 36 may be formed of the same (or different) materials. It should be noted that the initial mold 34 and the additional mold 36 may be similar to any of the molds 14 described above.

The powder may be melted on to the electronic components, substrates and/or molds in any manner that is known now, or discovered in the future. The type of process that is used to form the coating on the electronic package 10 will depend on a variety of manufacturing considerations.

One example process includes using an Atmospheric Pressure Plasma Jet to deposit pulverized metal powder onto the electronic package 10. As an example, fine powder metal particles may be injected into a plasma beam by a powder feeding system. The powder particles then absorb the thermal energy of the plasma beam. The powder particles then melt on the grain boundary and/or melt completely before being deposited on the substrate. It should be noted that the powder metal particles may be accelerated through the melting source in order to gain high kinetic energy while being directed toward the substrate surface.

In one example process, the area where the powder metal particles is to be deposited is cleaned. As an example, organic contaminants may be removed by using oxidation and/or evaporation.

The process may further include preparing the surface to be coated crating hydroxyl groups (and potentially other functional groups) on the surface of the substrate (e.g., by directing air-based plasma on the surface). In some forms, the surface of the substrate may be initially coated with precursors before a surface is coated with powder metal particles (e.g., silicon oxide).

The example electronic packages and methods described herein may provide advantages over conventional electronic packaging techniques in terms of yield improvement, package warpage control and/or z-height reduction.

Figure 5:
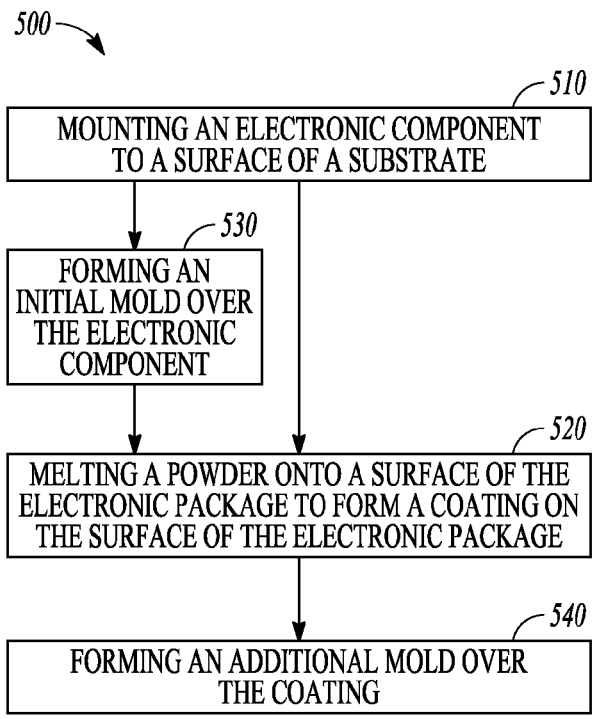
FIG. 5 is flow diagram illustrating an example method of fabricating an electronic package.

FIG. 5 is flow diagram illustrating an example method [500] of fabricating an electronic package. The method [500] includes mounting an electronic component to a surface of a substrate. The method [510] further includes [520] melting a powder onto a surface of the electronic package to form a coating on the surface of the electronic package.

It should be noted that the electronic component may be mounted to a surface of a substrate in any manner that in known now, or discovered in the future. In addition, the powder may be melted onto a surface of the electronic package to form a coating in any manner that in known now, or discovered in the future (e.g., by using a plasma spraying process).

As shown in FIG. 1, [520] melting a powder onto a surface of the electronic package 10 to form a coating 13 on the surface of the electronic package 10 may include melting a powder onto the substrate 11. As shown in FIG. 2, [520] melting a powder onto a surface of the electronic package 20 to form a coating 23 on the surface of the electronic package 20 may include melting a powder onto the electronic component 22.

As shown in FIG. 3, the method [500] may further include [530] forming an initial mold 34 over the electronic component 30 such that [520] melting a powder onto a surface of the electronic package 30 includes melting a powder onto the initial mold 34 to form a coating 33 on the initial mold 34. As shown in FIG. 4, the method [500] may further include [540] forming an additional mold 36 over the coating 33. It should be noted that the initial mold 34 and the additional mold 36 may be formed in any manner that in known now, or discovered in the future (e.g., by using injection molding, compression molding, press-fit configurations and semi-additive lithography processes).

Figure 6:
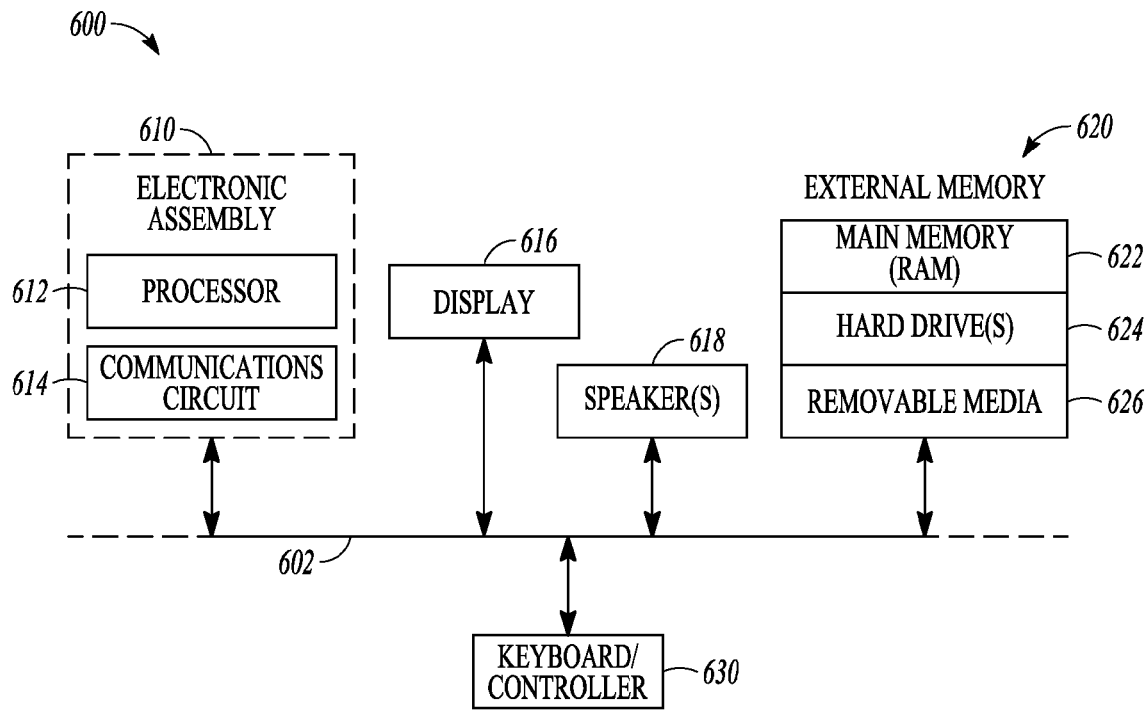
FIG. 6 is block diagram of an electronic apparatus that includes the electronic packages described herein.

FIG. 6 is a block diagram of an electronic apparatus 600 incorporating at least one electronic package and/or method described herein. Electronic apparatus 600 is merely one example of an electronic apparatus in which forms of the electronic packages 10, 20, 30 and methods [500] described herein may be used. Examples of an electronic apparatus 600 include, but are not limited to, personal computers, tablet computers, mobile telephones, game devices, MP3 or other digital music players, etc.

In this example, electronic apparatus 600 comprises a data processing system that includes a system bus 602 to couple the various components of the electronic apparatus 600. System bus 602 provides communications links among the various components of the electronic apparatus 600 and may be implemented as a single bus, as a combination of busses, or in any other suitable manner.

An electronic assembly 610 as describe herein may be coupled to system bus 602. The electronic assembly 610 may include any circuit or combination of circuits. In one embodiment, the electronic assembly 610 includes a processor 612 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic assembly 610 are a custom circuit, an application-specific integrated circuit (ASIC), or the like, such as, for example, one or more circuits (such as a communications circuit 614) for use in wireless devices like mobile telephones, tablet computers, laptop computers, two-way radios, and similar electronic systems. The IC can perform any other type of function.

The electronic apparatus 600 may also include an external memory 620, which in turn may include one or more memory elements suitable to the particular application, such as a main memory 622 in the form of random access memory (RAM), one or more hard drives 624, and/or one or more drives that handle removable media 626 such as compact disks (CD), flash memory cards, digital video disk (DVD), and the like.

The electronic apparatus 600 may also include a display device 616, one or more speakers 618, and a keyboard and/or controller 630, which can include a mouse, trackball, touch screen, voice-recognition device, or any other device that permits a system user to input information into and receive information from the electronic apparatus 600.

To better illustrate the electronic packages and methods disclosed herein, a non-limiting list of examples is provided here:

Example 1 includes an electronic package that includes a substrate; an electronic component mounted to a surface of the substrate; and a porous coating that includes grains of metal powder, wherein the porous coating is formed onto the electronic component by melting the metal powder onto the electronic component.

Example 2 includes the electronic package of example 1, wherein the substrate is a printed circuit board, and wherein the electronic component is a die.

Example 3 includes the electronic package of any one of examples 1-2, wherein the porous coating is between 5 and 400 microns thick.

Example 4 includes the electronic package of any one of examples 1-3, wherein the metal powder is formed of copper.

Example 5 includes the electronic package of any one of examples 1-4, wherein the porous coating has a grain boundary size less than 30 micrometers.

Example 6 includes the electronic package of examples 1-5, wherein the porous coating partially covers the electronic component.

Example 7 includes the electronic package of any one of examples 1-6, and further including a mold covering the coating.

Example 8 includes an electronic package that includes a substrate; an electronic component mounted to a surface of the substrate; and a porous coating that includes grains of metal powder formed onto the substrate by melting the metal powder onto the substrate.

Example 9 includes the electronic package of example 8, wherein the substrate is a printed circuit board, and wherein the electronic component is a die.

Example 10 includes the electronic package of any one of examples 8-9, wherein the porous coating is between 5 and 400 microns thick.

Example 11 includes the electronic package of any one of examples 8-10, wherein the metal powder is formed of copper.

Example 12 includes the electronic package of any one of examples 8-11, wherein the porous coating has a grain boundary size less than 30 micrometers.

Example 13 includes the electronic assembly of examples 8-12, and further including a mold covering the substrate and the electronic component.

Example 14 includes an electronic package that includes a substrate; an electronic component mounted to a surface of the substrate; an initial mold covering the electronic component; and a porous coating that includes grains of metal powder formed onto the initial mold by melting the metal powder onto the initial mold.

Example 15 includes the electronic package of example 14, wherein the substrate is a printed circuit board, and wherein the electronic component is a die.

Example 16 includes the electronic package of any one of examples 14-15, wherein the porous coating is between 5 and 400 microns thick.

Example 17 includes the electronic package of any one of examples 14-16, wherein the metal powder is formed of copper.

Example 18 includes the electronic package of any one of examples 14-17, wherein the porous coating has a grain boundary size less than 30 micrometers.

Example 19 includes the electronic package of any one of examples 14-18, and further including an additional mold covering the porous coating.

Example 20 includes the electronic package of example 19, wherein the initial mold and the additional mold are formed of the same material.

Example 21 includes method of fabricating an electronic package. The method includes mounting an electronic component to a surface of a substrate; and melting a metal powder onto a surface of the electronic package to form a porous coating that includes grains of metal powder on the surface of the electronic package.

Example 22 includes the method of example 21, wherein melting a metal powder onto a surface of the electronic package includes melting the metal powder onto the substrate.

Example 23 includes the method of any one of examples 21-22, wherein melting a metal powder onto a surface of the electronic package includes melting the metal powder onto the electronic component.

Example 24 includes the method of any one of examples 21-23, and further including forming an initial mold over the electronic component, and wherein melting a metal powder onto a surface of the electronic package includes melting the metal powder onto the initial mold to form a porous coating on the initial mold.

Example 25 includes the method of any one of examples 21-24, and further including forming an additional mold over the coating.

These and other examples and features of the present electronic assemblies and electronic packages will be set forth in part in the detailed description.

This overview is intended to provide non-limiting examples of the present subject matter. It is not intended to provide an exclusive or exhaustive explanation. The detailed description is included to provide further information about the methods [800], electronic assemblies 30 and/or electronic packages 10 described herein.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to comply with 37 C.F.R. §1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An electronic package, comprising: a substrate; an electronic component mounted to a surface of the substrate; an initial mold formed of a polymer mold covering an upper surface the electronic component; and a porous coating containing a combination of metal particles that includes grains of metal powder formed onto an upper surface of the initial mold; and an additional mold formed of a polymer; the additional mold covering an upper surface of the porous coating.

2. The electronic package of claim 1, wherein the substrate is a printed circuit board, and wherein the electronic component is a die.

3. The electronic package of claim 1, wherein the porous coating is between 5 and 400 microns thick.

4. The electronic package of claim 1, wherein the metal powder is formed of copper.

5. The electronic package of claim 1, wherein the porous coating has a grain boundary size less than 30 micrometers.

6. The electronic package of claim 1, wherein the initial mold and the additional mold are formed of the same material.

7. A method of fabricating an electronic package, comprising:
- mounting an electronic component to a surface of a substrate such that the electronic component is electrically connected to the substrate; and
- melting a metal powder onto a surface of the electronic package to form a porous coating that includes grains of metal powder on the surface of the electronic package, wherein the porous coating covers an entire upper surface of the electronic component.

8. The method of claim 7, wherein melting a metal powder onto a surface of the electronic package includes melting the metal powder onto the substrate.

9. The method of claim 7, wherein melting a metal powder onto a surface of the electronic package includes melting the metal powder onto the electronic component.

10. The method of claim 7, wherein melting a metal powder onto a surface of the electronic package includes using a plasma jet to deposit pulverized metal onto the surface of the electronic package.

* * * * *